(12) United States Patent
Sullivan (10) Patent No.: US 10,437,340 B1
(45) Date of Patent: Oct. 8, 2019

(54) DEVICE FOR PROVIDING THERMORECEPTIVE HAPTIC FEEDBACK

(71) Applicant: Sean Sullivan, Austin, TX (US)

(72) Inventor: Sean Sullivan, Austin, TX (US)

( * ) Notice: Subject to any disclaimer, the term of this patent is extended or adjusted under 35 U.S.C. 154(b) by 0 days.

(21) Appl. No.: 16/260,952

(22) Filed: Jan. 29, 2019

(51) Int. Cl.
| | |
|---|---|
| *G06F 3/01* | (2006.01) |
| *G01K 13/00* | (2006.01) |
| *G08B 6/00* | (2006.01) |
| *G09B 21/00* | (2006.01) |
| *H01L 35/02* | (2006.01) |
| *H01L 35/28* | (2006.01) |
| *H01L 25/04* | (2014.01) |

(52) U.S. Cl.
CPC .......... *G06F 3/016* (2013.01); *G01K 13/002* (2013.01); *G06F 3/011* (2013.01); *G06F 3/014* (2013.01); *G08B 6/00* (2013.01); *G09B 21/003* (2013.01); *H01L 25/04* (2013.01); *H01L 35/02* (2013.01); *H01L 35/28* (2013.01)

(58) Field of Classification Search
CPC .......... G06F 3/011; G06F 3/014; G06F 3/016; G08B 6/00; G09B 21/003
See application file for complete search history.

(56) References Cited

U.S. PATENT DOCUMENTS

| | | |
|---|---|---|
| 5,565,840 A | 10/1996 | Thorner et al. |
| 5,709,219 A | 1/1998 | Chen et al. |
| 5,984,880 A | 11/1999 | Lander et al. |
| 6,210,771 B1 | 4/2001 | Post et al. |
| 6,448,977 B1 | 9/2002 | Braun et al. |
| 8,593,409 B1 | 11/2013 | Heubel et al. |
| 8,665,241 B2 | 3/2014 | Heubel et al. |
| 9,292,091 B1 | 3/2016 | Grivna et al. |
| 9,293,015 B2 | 3/2016 | Mar et al. |
| 9,478,067 B1 * | 10/2016 | Worley, III ............. G06F 3/016 |

(Continued)

FOREIGN PATENT DOCUMENTS

CN          205318322 U       6/2016

OTHER PUBLICATIONS

Massie, Thomas, "Initial Haptic Explorations with the Phantom: Virtual Touch Through Point Interaction", Jan. 19, 1996, Massachusetts Institute of Technology Department of Mechanical Engineering, Thesis for Master of Science, Cambridge, MA (49 pages).

*Primary Examiner* — Andrew W Bee
(74) *Attorney, Agent, or Firm* — Daniel F. Nesbitt; Hasse & Nesbitt LLC (57) ABSTRACT

A device for providing thermoreceptive haptic feedback includes a first array of low mass elements, arranged in a geometric pattern, the array having a first temperature and a first collective thermal effusivity, and configured for selectively contacting a user, a second array of low mass elements, interspersed among the low mass elements of the first array, and thermally isolated from the low mass elements the first array, the array having a second temperature and a second collective thermal effusivity, and configured for selectively contacting a user, and a means for mechanical switching coupled to the low mass elements of the first and the second arrays and configured to place selected low mass elements of the first and the second arrays in contact with a user, to realize a thermal effusivity between the first collective thermal effusivity and the second collective thermal effusivity.

19 Claims, 9 Drawing Sheets

(56) References Cited

U.S. PATENT DOCUMENTS

| | | |
|---|---|---|
| 9,671,826 B2 | 6/2017 | Levesque et al. |
| 9,672,702 B2 | 6/2017 | Coish et al. |
| 2005/0113167 A1 | 5/2005 | Buchner et al. |
| 2006/0143342 A1 | 6/2006 | Kim et al. |
| 2007/0063849 A1 | 3/2007 | Rosella et al. |
| 2008/0000891 A1 | 1/2008 | Burr et al. |
| 2008/0120029 A1 | 5/2008 | Zelek et al. |
| 2008/0132313 A1 | 6/2008 | Rasmussen et al. |
| 2009/0106655 A1 | 4/2009 | Grant et al. |
| 2009/0120105 A1 | 5/2009 | Ramsay et al. |
| 2010/0079264 A1 | 4/2010 | Hoellwarth |
| 2010/0141407 A1 | 6/2010 | Heubel et al. |
| 2010/0160016 A1 | 6/2010 | Shimabukuro et al. |
| 2011/0012717 A1 | 1/2011 | Pance et al. |
| 2012/0116672 A1 | 5/2012 | Forutanpour et al. |
| 2012/0162113 A1 | 6/2012 | Lee |
| 2013/0099907 A1 | 4/2013 | Ching et al. |
| 2013/0115579 A1* | 5/2013 | Taghavi .................. G06F 3/016 434/113 |
| 2014/0176462 A1 | 6/2014 | Ponziani et al. |
| 2014/0266646 A1* | 9/2014 | Urbach .................... G08B 6/00 340/407.1 |
| 2016/0187977 A1 | 6/2016 | Cruz-Hernandez et al. |
| 2016/0274662 A1 | 9/2016 | Rimon et al. |
| 2016/0296838 A1 | 10/2016 | Goetgeluk et al. |
| 2016/0378214 A1* | 12/2016 | Chi ..................... G06F 3/04883 345/173 |
| 2017/0108929 A1 | 4/2017 | Sinko et al. |
| 2017/0131775 A1 | 5/2017 | Clements |
| 2017/0168577 A1* | 6/2017 | Keller .................... G06F 3/016 |
| 2017/0212589 A1* | 7/2017 | Domenikos ............. G06F 3/014 |
| 2018/0079429 A1* | 3/2018 | Prokhorov ............. B60W 50/16 |
| 2018/0116601 A1* | 5/2018 | Yi ............................ A61B 5/01 |
| 2018/0116602 A1* | 5/2018 | Yi ............................ A61B 5/01 |
| 2018/0144549 A1* | 5/2018 | Gonzalez ........... G02B 27/0101 |
| 2019/0011040 A1* | 1/2019 | Fribus .................... B60K 35/00 |
| 2019/0063797 A1* | 2/2019 | Yi ............................ F25B 21/04 |
| 2019/0087049 A1* | 3/2019 | Mani .................... G06F 3/0416 |

* cited by examiner

DEVICE FOR PROVIDING THERMORECEPTIVE HAPTIC FEEDBACK

TECHNICAL FIELD

This application relates generally to virtual and augmented reality systems, and more particularly, to devices that provide haptic feedback in those systems.

BACKGROUND

Humans generally perceive their environment through five traditionally recognized senses—sight or vision; hearing or audition; taste or gustation; smell or olfaction; and touch or somatosensation. The ability to detect other stimuli beyond those governed by these five most broadly recognized senses also exists. These sensory modalities include: temperature or, thermoception or thermoreception; kinesthetic sense or proprioception; pain or nociception; balance or equilibrioception; vibration/pressure or mechanoreception; and various internal stimuli, for example, the different chemoreceptors for detecting salt and carbon dioxide concentrations in the blood, or sense of hunger and sense of thirst.

Although the origins of virtual reality can be traced back more than one hundred and fifty years, the exact origins are in dispute, in part, due to difficulty in defining the concept of an alternative existence. Elements of virtual reality appeared as early as the 1860s. The first of what might be referred to as wide-spread "virtual reality systems," typically centered around the use of projected images with accompanying sound, i.e., sight and sound, to create a virtual environment. However, including only sight and sound, these systems were limited in their immersive nature, or "immersivity," or limited in the sense of being able to give a person a sense of truly being "in" the virtual environment.

Today, due to the general availability and widespread use of computers, virtual reality can be defined as a computer technology that recognizes these basic senses and sensory modalities, and that uses various devices to provides stimuli associated therewith, to create a virtual or an imaginary environment. Still, many modern virtual reality systems are often limited to virtual reality headsets and accompanying auditory systems that provided sight and sound stimuli to create a virtual or imaginary environment. However, again, being limited to sight and sound, these systems are, likewise, not particularly immersive—offering a person a sense of being "in" the virtual environment. To this end, other virtual reality systems have been expanded to include the transmission of vibrations and other sensations to the user through, for example, a game controller, and are known as haptic systems, the tactile or touch related information generally known as forced feedback in gaming, medical, and military training applications.

Haptic communication is non-verbal communication, and refers to the ways in which people and animals communicate and interact using the sense of touch. In virtual reality systems, "haptics" refers to the science of applying touch sensations and controls to interactions with computer applications. Haptics offers an extra dimension to virtual reality environments and is essential to the feeling of true immersion in those environments, and are most commonly found in the use of vibration or electrostatic shock in contact with the skin. Today, in virtual or augmented reality systems using haptic feedback technologies, the dimension of thermoreception is largely omitted. Again, haptic feedback is mainly focused on the kinesthetic sense and/or mechanoreception, mimicking pressure.

Thermoception or thermoreception is the sense by which people and animals perceive temperature. The details of how temperature receptors in people and animals work is still being investigated. However, different materials are typically perceived to be at different temperatures, even if they are, in fact, at the same temperature. For example, when a person touches a piece of wood and a piece of metal, both of which are at the same temperature, the metal generally feels colder than the wood. This is due to the different materials or, in this example, wood and metal, having different thermal transfer properties. Further, this is also important for a person's tactile sensation of coming into contact with liquid. There is no known particular type of nerve ending for sensing a liquid. Rather, liquids are recognized as a combination of kinesthetic and/or mechanoreception and thermoreceptive stimuli.

Accordingly, there is a need for a technology that can simulate the sensation of touching materials with different thermal properties, allowing for a more immersive virtual haptic, tactile environment.

SUMMARY OF THE INVENTION

According to one embodiment, a device for providing thermoreceptive haptic feedback includes a first array of low mass elements, arranged in a geometric pattern, the array having a first temperature and a first collective thermal effusivity, and configured for selectively contacting a user, a second array of low mass elements, interspersed among the low mass elements of the first array, and thermally isolated from the low mass elements of the first array, the array having a second temperature and a second collective thermal effusivity, and configured for selectively contacting a user, and a means for mechanical switching coupled to the low mass elements of the first and the second arrays and configured to place selected low mass elements of the first and the second arrays in contact with a user, to realize a thermal effusivity between the first collective thermal effusivity and the second collective thermal effusivity According to another embodiment, the device further includes a first temperature means for at least one of raising and lowering the first temperature of the first array of low mass elements.

According to another embodiment, the device further includes a second temperature means for at least one of raising and lowering the second temperature of the second array of low mass elements.

According to another embodiment, the first and the second temperature means is selected from the list of resistive heating; infrared heating; controlled chemical reactions; evaporative cooling; liquid cooling/heating; forced air cooling and heating; phase change materials; at least one of nanowire, nanotube, and nano-mesh; flexible thermoelectric materials; and materials having variable and tunable thermal conductivity and heat capacity.

According to another embodiment, the first and the second temperature means is one or more Peltier modules.

According to another embodiment, the first and the second temperature means is one or more Peltier modules having a first side and a second side, the first side coupled to the first array of low mass elements and the second side coupled to the second array of low mass elements, and configured to pass heat there between.

According to another embodiment, the device further includes a sensor configured to measure the skin temperature of a user, the skin temperature used to calibrate the device to a virtual reality simulation.

According to another embodiment, the device further includes a control unit electrically coupled the means for mechanical switching and the sensor, the control unit configured to actuate the means for mechanical switching in response to the measured skin temperature to calibrate the virtual reality simulation.

According to still another embodiment, the device further includes a feedback system, the feedback system including a temperature sensor configured to measure the skin temperature of a user and a control unit electrically coupled to the temperature sensor and the means for mechanical switching, the control unit responsive to a virtual reality simulation, and configured to actuate the means for mechanical switching in response to the temperature sensor and the virtual reality simulation.

According to yet another embodiment, the controller is further configured to actuate the means for mechanical switching to place selected low mass elements of the first and the second arrays in contact with a user to realize a thermal gradient across the skin of a user.

In operation, the device stores the thermal profile for a virtual item, either assumes or senses the skin temperature of a user, actuates a means for mechanical switching coupled to low mass elements of first and second arrays, and places selected low mass elements of the first and the second arrays in contact with the user based on the thermal profile for the virtual item in response to a virtual reality simulation displaying the item.

The device further energizes a temperature means for raising and/or lowering the temperature of the elements in the first or the second array.

The device further energizes a temperature means for heating and cooling elements in the first and the second arrays, whereby at least one of the elements in the first array is heated while at least one of the elements in the second array is simultaneously cooled.

The device further calibrates the application of a material with a selected thermal effusivity to the skin temperature of the user.

The device also places selected elements of the first and the second arrays of low mass elements in contact with the user to realize a thermal gradient across the skin of the user.

BRIEF DESCRIPTION OF THE DRAWINGS

Various embodiments of a device for providing thermoreceptive haptic feedback to mimic different materials will become better understood with regards to the following description, appended claims and accompanying drawings wherein like numerals denote like parts, and wherein:

DETAILED DESCRIPTION OF THE INVENTION

Definitions

As used in this specification and in the claims, the term, "haptic," generally relates to or is based on the sense of touch, and more specifically, refers to any form of interaction between a human and a device, an apparatus, or a machine involving touch.

As used herein, the term, "thermal effusivity" refers to the rate at which a material can absorb heat.

As used herein, the term "kinesthetic feedback" describes the knowledge people have of the position of their body, and the movements they have just performed, based on feedback from their nerve endings into their central nervous system.

The term "virtual reality" refers to an artificial environment that is experienced through sensory stimuli, e.g., sight and sound, provided by a computer and in which a person's actions partially determine what happens in the environment.

The term "augmented reality," for example, refers to an enhanced version of reality created through the use of technology that overlays digital information on an image of something being viewed through an electronic device, such as a smartphone or smartwatch. More generally, the term augmented reality refers to technology used to augment, or add to, reality and not to replace reality.

The term "semi-infinite body" refers to an idealized body that has a single planar surface that extends to infinity in all directions. This idealized body is used to indicate that the temperature change in the part of the body under consideration, i.e., the region closest to the surface, is due to the thermal conditions on the single surface.

DETAILED DESCRIPTION OF THE INVENTION

In one embodiment, the present invention comprises an array of elements that can change their temperature in order to simulate the sensation of touching objects with different thermal effusivities. A material's thermal effusivity (e) can be defined as the square root of the product of its density ($\rho$), its specific heat capacity ($C_p$), and its thermal conductivity ($\kappa$), as described by Equation 1.

$$e = \sqrt{\rho C_p \kappa}$$

In various embodiments, the present invention can be included in handheld or wearable technologies, such as, for example, in a game controller or a glove. In other embodiments, such as in a game controller, the present invention can be electrically coupled or associated with a virtual reality headset so as to operate in unison therewith. Alternatively, and in still other embodiments, a handheld or wearable technology can be a smartphone or smartwatch.

To simulate different materials with different thermal effusivities, a device, in accordance with principles of the present invention, has the ability to change its thermal characteristics, either (i) by changing its temperature and/or (ii) by changing its thermal effusivity, i.e., contacting a user with different materials and/or different amounts of a particular material. In accordance with principles of the present invention, and in one embodiment, a device can change its temperature. For two semi-infinite bodies, for example, a hand and some other surface, in thermal contact with one another, each with a different thermal effusivity and temperature, the measured or perceived temperature ($T_p$) at the point of contact is the arithmetic average weighted by each material's thermal effusivity, as denote by Equation 2, $$T_p = \frac{(T_s e_s + T_h e_h)}{(e_s + e_h)}$$

where $T_S$ and $e_s$ are the temperature and thermal effusivity of the surface, respectively, and $T_h$ and $e_h$ are the temperature and thermal effusivity of a user's hand, respectively. It follows that for a fixed user hand temperature ($T_h$) and effusivity ($e_h$), and surface effusivity ($e_s$), the perceived temperature ($T_p$) can be manipulated by varying the surface temperature ($T_s$). Thus, Equation 2 can be rearranged as shown in Equation 3.

$$e_s = \frac{e_h(T_h - T_p)}{T_p - T_s}$$

Equation 3 shows that simulated thermal effusivity ($e_s$) is a function of the user's hand temperature ($T_h$) and thermal effusivity ($e_h$), and the perceived temperature ($T_p$). In some embodiments, the thermal effusivity of skin ($e_h$) found on most users' hands can be assumed to be constant, and equal to the value for human skin. The same can be said for a user's skin temperature ($T_h$). In other embodiments, rather than assuming a user's skin temperature is a constant, the device can include a sensor configured to measure the user's skin temperature in order to calibrate a virtual reality simulation.

To quickly and accurately simulate a change in thermal effusivity in accordance with principles of the present invention, the temperature should be able to be controlled "quickly and accurately." For example, the frame rates used for film and television have been standardized by the Society of Motion Picture and Television Editors. Since 1927, the standard frame rate for film has been 24 frames per second (fps), while video formats use a variety of frame rates, ranging from 25 or 30 fps, based on the mains frequency of electric grids, to 120, 240, or 300 fps, allowing for frame multiplication in modern displays. Further, when a device in accordance with principles of the present invention is associated with a virtual or augmented reality simulation, wherein a user views a film or video presentation, the haptic feedback, e.g., temperature change, can be provided in as little as about 1/24 of a second or about 42 milliseconds; about 1/25 or 1/30 of a second or about 40 or 33 milliseconds; to about 1/120, 1/240 or 1/300 of a second or about 8, 4, or 3 milliseconds, haptic feedback being provided within a single frame. Thus, in some embodiments "quickly and accurately" refers to about 42 milliseconds, about 40 or 33 milliseconds, or about 8, 4 or 3 milliseconds, should a change within a single frame be desired or necessitated. In other embodiments, different amounts of time can also be deemed "quick and accurate" should a temperature change over the course of multiple frames be acceptable. In those embodiments, the time period associated with the particular frame rate used in the system can be multiplied by the number of frames over which a change in temperature occurs to arrive at a time period that is "quick and accurate."

However, the temporal resolution of the perceived temperature change can be limited by the speed of nerve transduction in humans. For example, for cold and warm thermoreceptors, the conduction speed can range from less than 1 meter per second to approximately or about 30 meters per second. Further, for a distance of 1 meter of travel from the source of transduction to the brain, a temporal resolution of between about 33 milliseconds and about 0.5 seconds would be required. Thus, in some embodiments "quickly and accurately" refers to between about 33 milliseconds and about 0.5 seconds, when considering the speed of nerve transduction in humans.

In one embodiment, this is accomplished by the use of arrays of thermoelectric Peltier modules in which each element in the array has a small thermal mass, thereby readily facilitating the change in temperature. For example, thermoelectric Peltier modules are available from CUI, Inc., Laird Technologies, and Marlow Industries, to name but a few manufacturers, and range in standard sizes from as small as about 2 millimeters in length by about 2 millimeters in width by less than 1 millimeter in height, to as large as about 70 millimeters in length by about 70 millimeters in width by about 27 millimeters in height, the largest of which weighs about 235 grams or about 0.05 grams per square millimeter, a 10 millimeter by 10 millimeter module weighing about 5 grams. Thus, in one embodiment, a small mass is about 5 grams or less. The thermal mass or inertia is the mass multiplied by the average specific heat capacity of the material. For example, assuming an average specific heat capacity of approximately 1 joule per gram-degree Centigrade (J/(g.° C.)), the thermal inertia is approximately 5 J/° C. for the entire module. However, generally, since the temperature of only half of the element, e.g., the cold side or the hot side, is being changed, the thermal inertia is approximately half, or 2.5 J/° C. Thus, in one embodiment, a small thermal mass is about 2.5 J/° C.

In other embodiments, the temperature can be controlled through the use of, but not necessarily limited to, resistive heating, controlled chemical reactions, evaporative cooling, liquid heating/cooling, force air or convective heating and cooling, phase change materials, a nanowire or nanotube array or mesh, flexible thermoelectric materials, and materials with variable and tunable thermal conductivity or heat capacity. Collectively, these can be referred to as tunable thermal devices.

Figure 1:
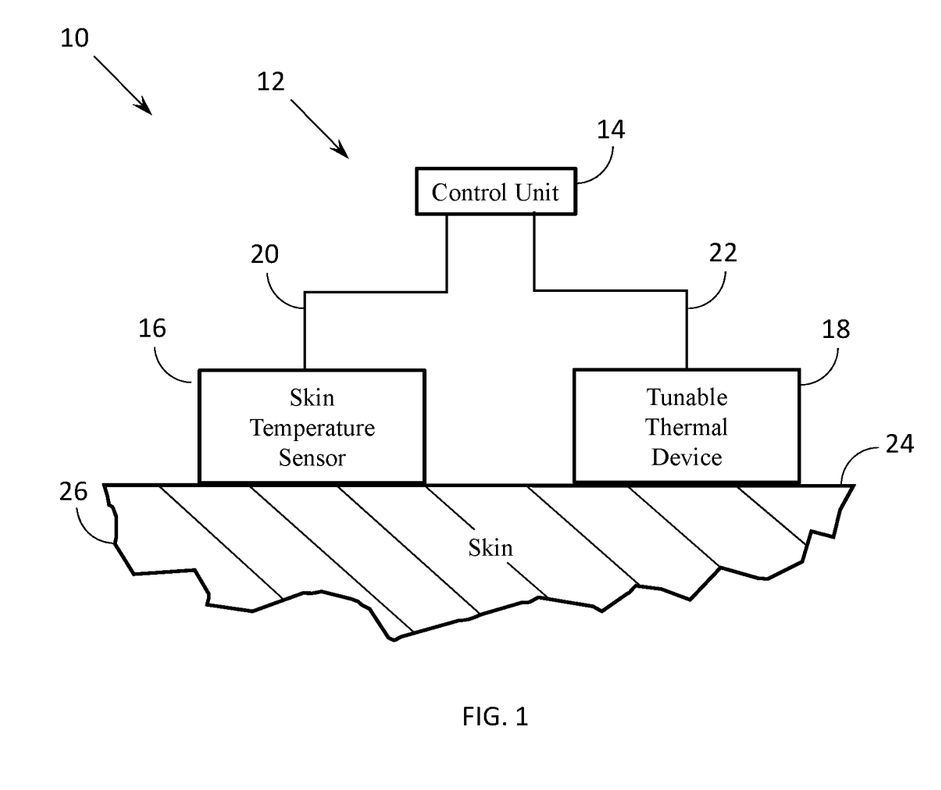
FIG. 1 is a block diagram of a thermoreceptive haptic feedback device 12 in accordance with principles of the present invention.

Referring now to FIG. 1, and in one embodiment 10, a block diagram of a thermoreceptive haptic feedback device 12 is shown. The thermoreceptive haptic feedback device 12 includes a control unit 14, a skin temperature sensor 16, and one or more tunable thermal devices 18. In the embodiment shown, the control unit 14 stores and executes software code including a virtual or augmented reality simulation. In other embodiments, the control unit can be part of a computer platform or a personal computer running a virtual or augmented reality simulation, i.e., software. As also shown, the skin temperature sensor 16 is electrically coupled and is responsive to the control unit 14 through a wire or cable 20, providing a measure of temperature, or a temperature input, thereto. Similarly, the one or more tunable thermal devices 18 are also electrically coupled and responsive to the control unit 14 through a printed wire board trace work, a wire, or a cable 22, the control unit 14 having the ability to control or actuate the one or more tunable thermal devices 18, so as to cause the one or more tunable thermal devices 18 to produce and/or absorb or sink heat in response thereto. Again, the one or more tunable thermal devices 18 can be arrays of thermoelectric Peltier modules in which each element in the array has a small thermal mass. Similarly, and in other embodiments, other thermal means described herein can be substituted, as desired or necessitated, for the Peltier modules without departing from the spirit of the present invention.

In use, the skin temperature sensor 16 and the one or more tunable temperature devices 18 are placed in proximity with one another, and in contact with the outer surface 24 of a user's skin 26. This allows the control unit 14 to measure the skin temperature of the user and apply heat thereto and/or absorb heat therefrom in response to a virtual or augmented reality simulation running on the control unit 14 or electrically coupled thereto or associated therewith.

Again, the control unit 14 can be part of a computer platform or a personal computer running a virtual or augmented reality simulation or the control unit 14, in still other embodiments, can be electrically coupled to other virtual or augmented reality hardware. In these embodiments, and in the virtual or augmented reality simulations running thereon, each material that a user can interact or come in contact with on a tactile level, has its temperature and thermal effusivity coded in, or stored in memory, as properties. Thus, when a user makes "virtual" contact with the material to be simulated, the thermoreceptive haptic feedback device 12 will tune its thermal properties so as to approximate the "feel" of the simulated material.

For example, in embodiments having temperature tuneability, the software will solve Equation 2 using the simulated temperature and thermal effusivity values for the surface, $T_s$ and $e_s$, respectively, and the assumed or measured values for the user's hand temperature and thermal effusivity, $T_h$ and $e_h$, respectively, in order to determine the proper temperature that the user would perceive by touching the simulated material. For the real thermal interaction between the user's skin, i.e., hand, and the device, at a temperature ($T_d$), and known thermal effusivity ($e_d$), the perceived temperature ($T_p$) can be described as shown by Equation 4.

$$T_p = \frac{(T_d e_d + T_h e_h)}{(e_d + e_h)}$$

For example, in order to simulate the required perceived temperature ($T_p$) associated with touching a particular material, the control unit 14, and the software running thereon, can set the device 12 temperature based on Equation 5.

$$T_d = \frac{e_h T_p + e_d T_p - e_h T_h}{e_d}$$

In addition to embodiments having temperature tuneability, embodiments of the present invention can also include the ability to mechanically select one or more of at least two surfaces having different thermal effusivities that can be configured to alternately and/or selectively contact a user's skin to provide differing temperature sensations, and that can be associated with a virtual or augmented reality simulation.

Figure 2:
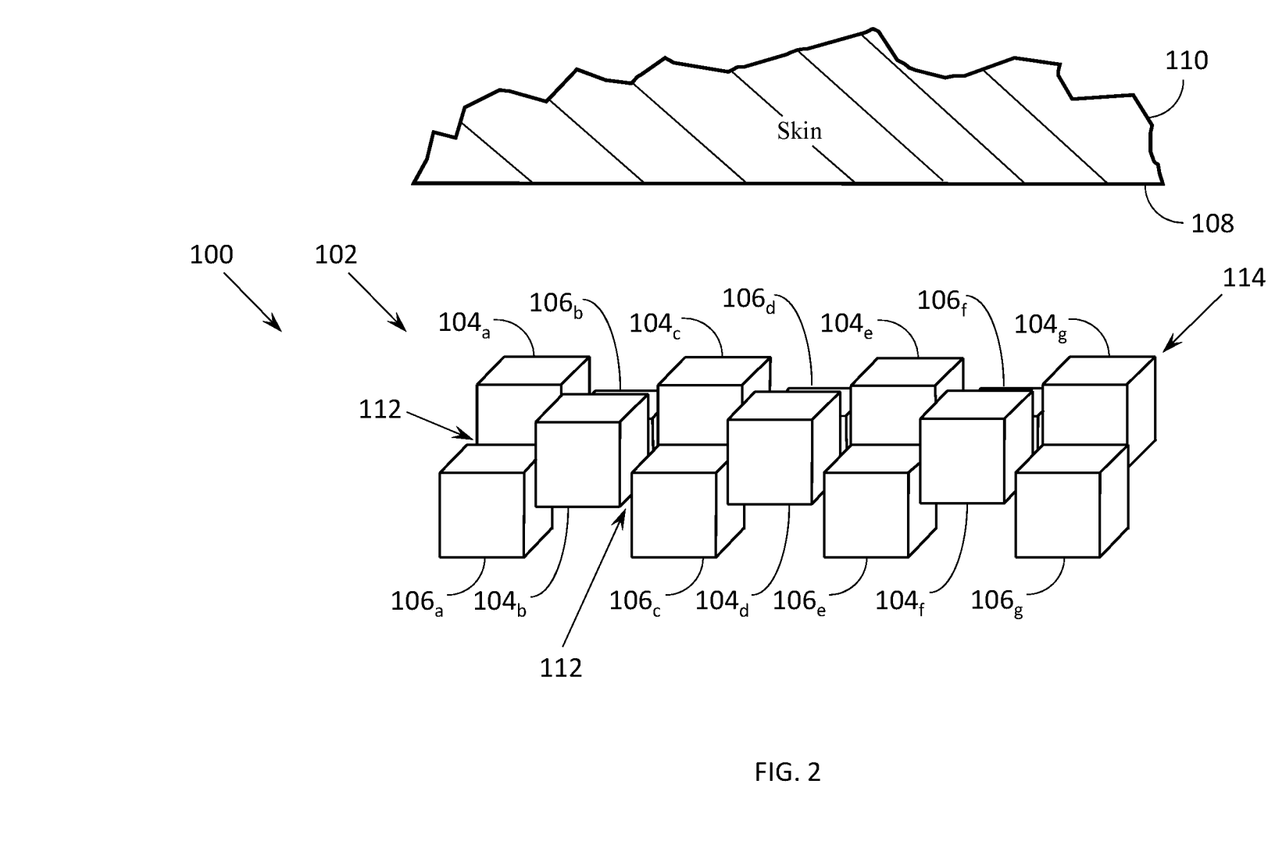
FIG. 2 is a diagram of an exemplary thermoreceptive haptic feedback device having first and second arrays of low mass elements in a first position.
Figure 3:
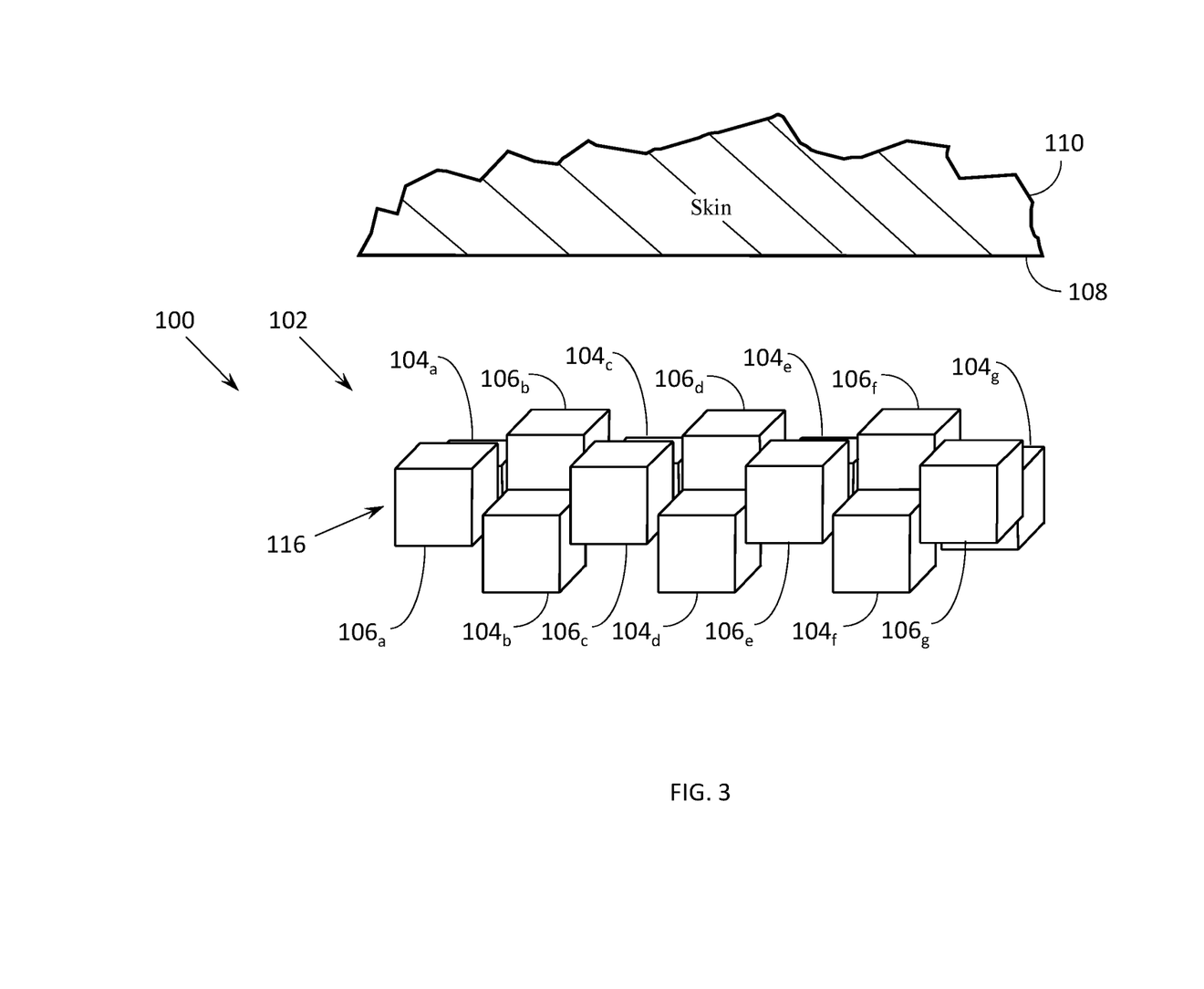
FIG. 3 is a diagram of the exemplary thermoreceptive haptic feedback device shown in FIG. 2, having first and second arrays of low mass elements in a second position.

Referring to FIGS. 2 and 3, an embodiment 100 of an exemplary device 102 for providing thermoreceptive haptic feedback by changing its thermal effusivity, in addition to its temperature, is shown. The device 102 comprises a first array of low mass elements 104$_{a-g}$, arranged in a geometric pattern, e.g., rows and columns, and a second array of low mass elements 106$_{a-g}$, interspersed among the first array of low mass elements 104$_{a-g}$. The first array of low mass elements 104$_{a-g}$ and the second array of low mass elements 106$_{a-g}$ are thermally isolated from one another, such as, for example, by spacing the elements of the first and second array apart by a distance, generally indicated at reference numeral 112 in FIG. 2, sufficient to prevent heat transfer between the elements.

The first array of low mass elements 104$_{a-g}$ has a first temperature and a first collective thermal effusivity, and the second array of low mass elements 106$_{a-g}$ has a second temperature and a second collective thermal effusivity. Both the first array of low mass elements 104$_{a-g}$ and the second array of low mass elements 106$_{a-g}$ are configured for selectively contacting an outer surface 108 of a user's skin 110, as will now be described in further detail in conjunction with FIGS. 2 and 3.

For example, and by way of additional explanation, the first array of low mass elements 104$_{a-g}$ can be made from a material that has a relatively high thermal effusivity, while the second array of low mass elements 106$_{a-g}$ can be made from a material that has a relatively low thermal effusivity, both of which can typically be at ambient room temperature. Further, the first array of low mass elements 104$_{a-g}$ with the relatively high thermal effusivity can be extended or projected upward, relative to the relatively low thermal effusivity second array of low mass elements 106$_{a-g}$, to a first position 114, as shown in FIG. 2, causing the first array of low mass elements 104$_{a-g}$ to contact the outer surface 108 of the user's skin 110, meanwhile positioning the second array of low mass elements 106$_{a-g}$ away from contact. When the relatively high thermal effusivity material used to construct the first array of low mass elements 104$_{a-g}$ contacts the user's skin 110, heat is transferred from the user's skin 110 to the first array of low mass elements 104$_{a-g}$, based on the temperature of the user's skin 110 being warmer than the ambient temperature of the first array of low mass elements 104$_{a-g}$, causing the user to perceive a "cool" or "cold" feeling that can, in turn, be associated with a virtual or augmented reality simulation.

Referring now to FIG. 3, and in the alternative, the relatively low thermal effusivity second array of low mass elements 106$_{a-g}$ can be extended or projected upward, in relation to the relatively high thermal effusivity first array of low mass elements 104$_{a-g}$, to a second position 116, causing the second array of low mass elements 106$_{a-g}$ to alternately contact the outer surface 108 of the user's skin 110, positioning the first array of low mass elements 104$_{a-g}$ away from contact. When the relatively low thermal effusivity material used to construct the second array of low mass elements 106$_{a-g}$, again, at ambient room temperature, contacts the user's skin 110, less heat is transferred from the user's skin 110 to the second array of low mass elements 106$_{a-g}$, again, based on the temperature of the user's skin 110 being warmer than the ambient temperature of the second array of low mass elements 106$_{a-g}$, causing the user to perceive a less "cool" or "cold" sensation or feeling that can also be associated with the virtual or augmented reality simulation.

Although FIG. 1 has been used to explain embodiments of the present invention having the ability to simulate different materials with different thermal effusivities through the use of a change in temperature in a thermal device, and FIGS. 2 and 3 have been used to explain embodiments of the present invention having the ability to simulate different materials with different thermal effusivities through the use of a change in thermal effusivity, i.e., contacting a user with different materials and/or different amounts of a particular material, the present invention is not hereby limited to either of these approaches. Rather, in still other embodiments, a device can use a combination of (i) changing the temperature of a thermal device and (ii) changing the thermal effusivity through the use of different materials to simulate different materials with different thermal effusivities.

In the embodiment 100 shown in FIGS. 2 and 3, both the first and the second array, $104_{a-g}$, $106_{a-g}$, respectively, each contain seven elements. However, arrays having seven elements are merely used for ease of explanation. In use, embodiments of the present invention, would likely include many more elements, based on how much spatial resolution is required to achieve the desired thermoreceptive haptic effect to mimic different materials and the area of the body that is being contacted. Further, embodiments having more than two arrays are also contemplated. Likewise, and again, two arrays were merely used for ease of explanation.

In the embodiment 100 shown in FIGS. 2 and 3, the low mass elements $104_{a-g}$, $106_{a-g}$ and generally square in shape. However, that need not necessarily be the case either, so long as the elements $104_{a-g}$, $106_{a-g}$ are of a shape that tessellates. For example, and in various embodiments, the elements $104_{a-g}$, $106_{a-g}$ can be in the shape of a triangle, a square, or a hexagon—the only regular shapes which tessellate by themselves. In still other embodiments, the present invention can include other tessellations of regular shapes, provided that more than one type of shape is used, for example, squares and triangles; hexagons and triangles; hexagons, squares, and triangles; octagons and squares; dodecagons and triangles; and, dodecagons, hexagons, and squares, to name but a few combinations. In still other embodiments, the present invention can use oval or rounded shapes. For example, a number of manufacturer produces Peltier modules that are round, some of which have a hole in the center. In yet other embodiments, the present invention can include other irregular shapes, should such a particular arrangement be desired or advantageous.

In the embodiment 100 shown, the low mass elements $104_{a-g}$, $106_{a-g}$ are on the scale of about 1 millimeter (mm) to about 1 centimeter (cm). In some other embodiments, depending on where the elements come in contact with or touch the user, the size of the low mass elements $104_a$-g, $106_{a-g}$ can vary depending on how much spatial resolution is required to achieve the desired thermoreceptive haptic effect to mimic different materials. Further, the thermal isolation is achieved by using a spacing 112, indicated in FIG. 2, of about 500 micrometers (μm) between the low mass elements $104_{a-g}$, $106_{a-g}$, a ratio of about 1 to 0.5 to about 1 to 0.05, and a thermally insulating material between the elements, at their bases, for the mounting thereof. This is shown in more detail in FIGS. 4-6.

Figure 4:
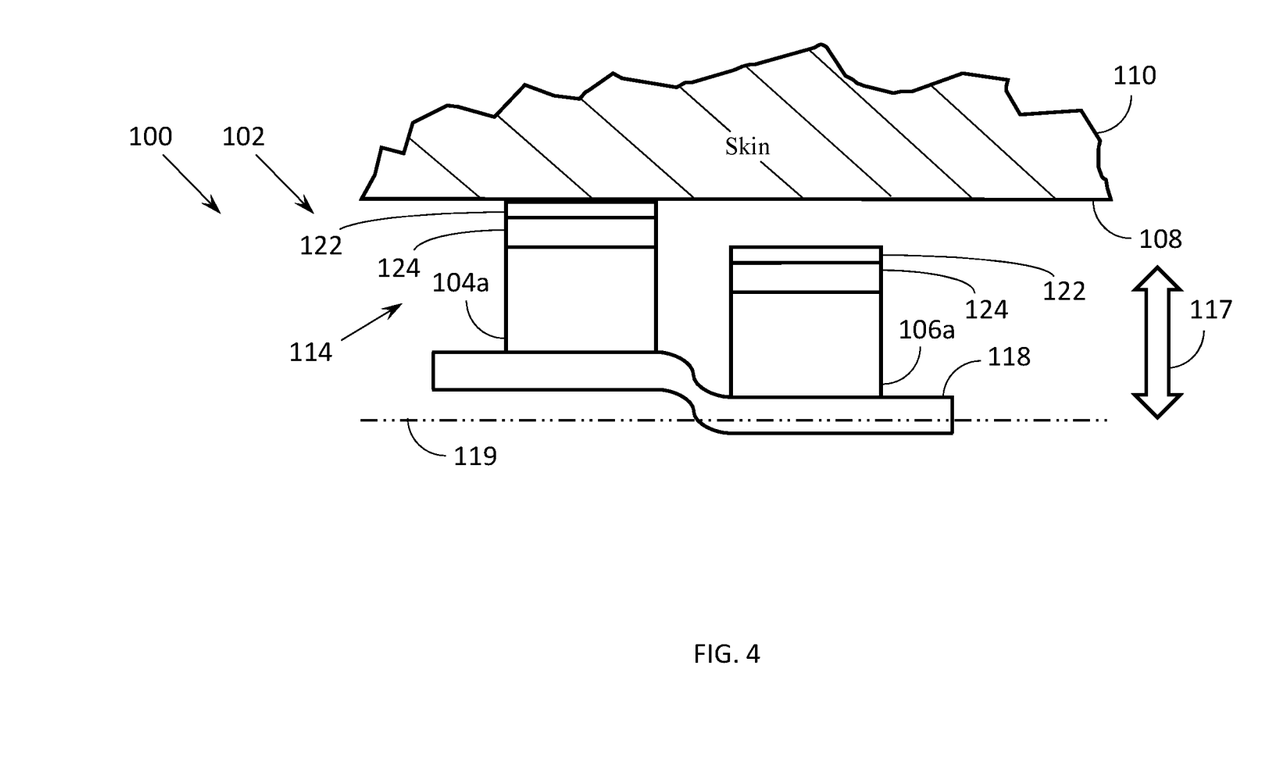
FIG. 4 is a diagram the exemplary thermoreceptive haptic feedback device shown in FIGS. 2 and 3, detailing the mounting of two low mass elements in the first position.
Figure 5:
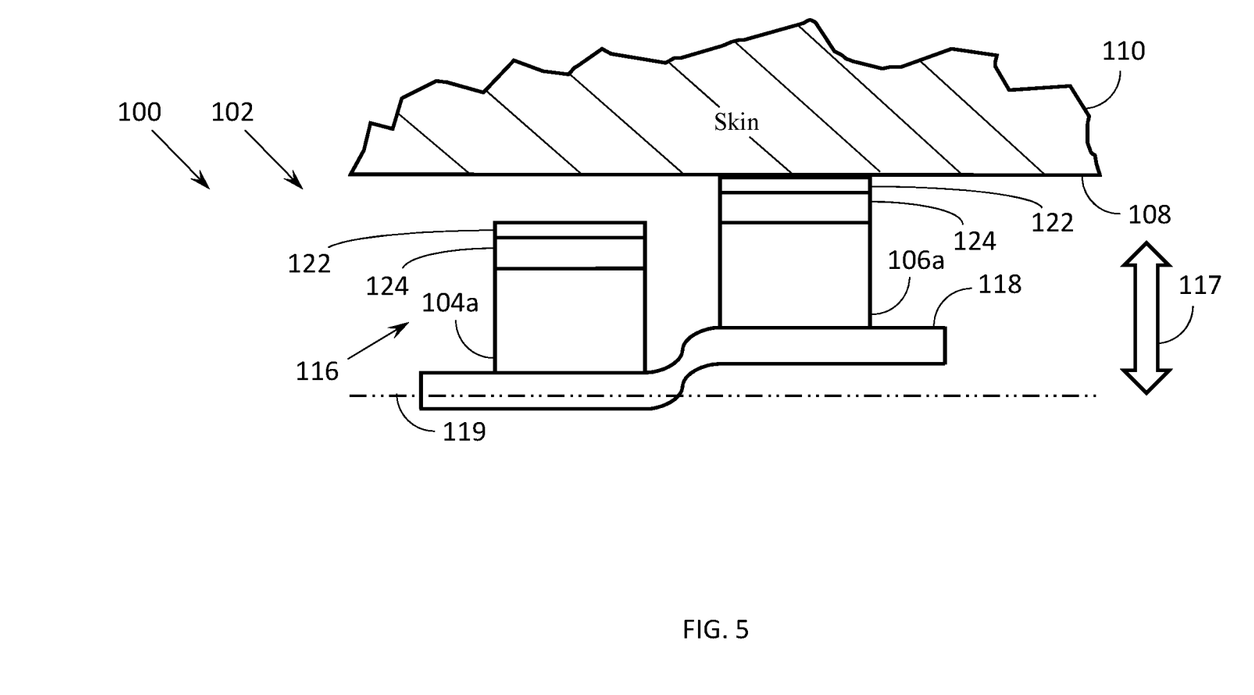
FIG. 5 is a diagram the exemplary thermoreceptive haptic feedback device shown in FIGS. 2 and 3, detailing the mounting of two low mass elements in the second position.
Figure 6:
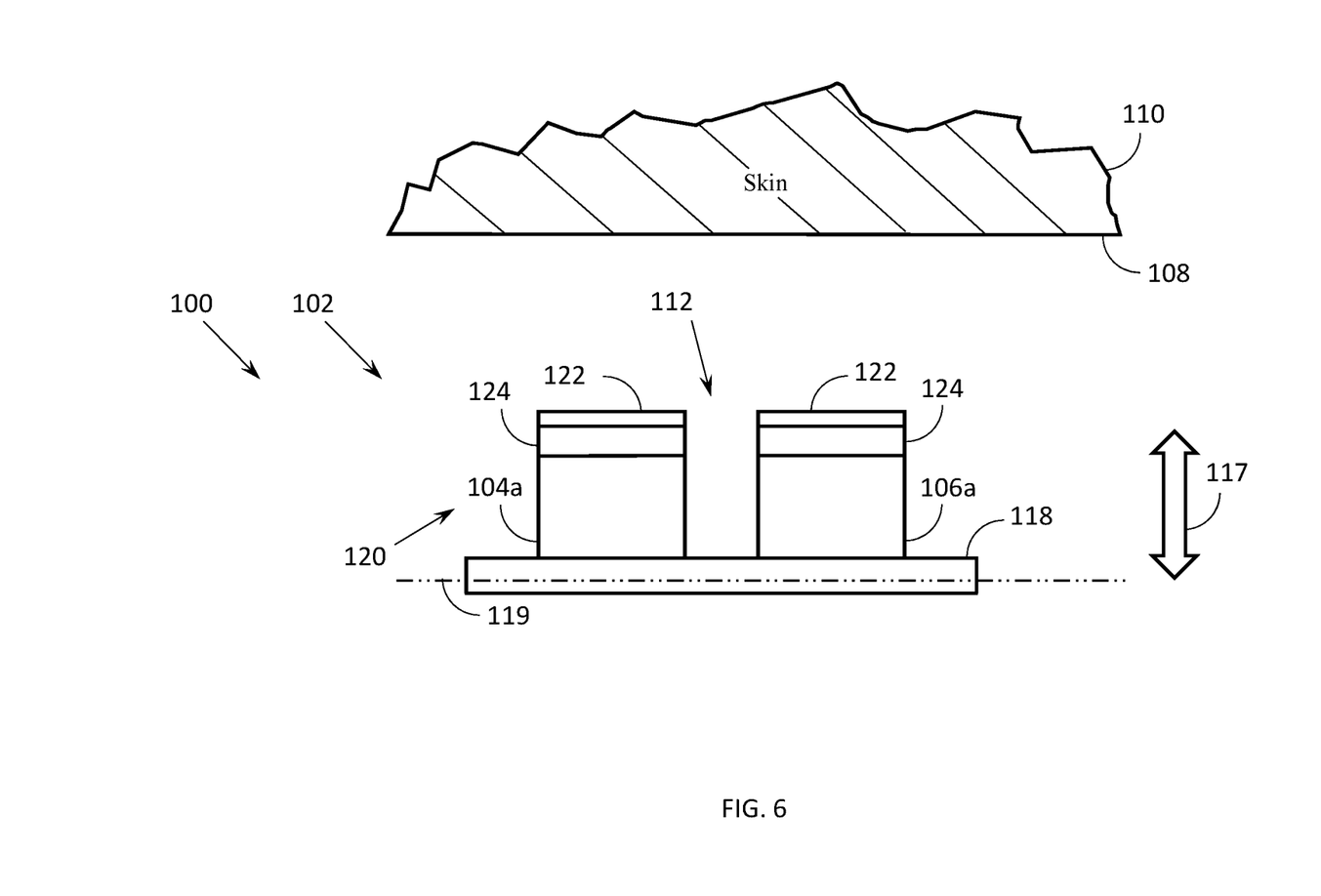
FIG. 6 is a diagram the exemplary thermoreceptive haptic feedback device shown in FIGS. 2 and 3, detailing the mounting of two low mass elements in a quiescent position.

Referring now to FIGS. 4-6, exemplary mounting detail for two adjacent low mass elements, one of which is in the first array and the other of which is the second array, i.e., low mass elements $104_a$ and $106_a$ of FIGS. 2 and 3, is shown. As depicted, the low mass elements $104_a$, $106_a$ are attached to a resilient polymer or polymeric foam material 118, for example, using an adhesive or through attachment in the molding of the material 118. A person of ordinary skill in the art will appreciate that other methods of attaching the low mass elements $104_{a-g}$, $106_{a-g}$ to the resilient polymer or polymeric foam material 118 can be used without departing from the spirit of the present invention.

As shown in FIGS. 4-6, the polymer or polymeric foam material 118 is resilient in nature, allowing the low mass elements $104_{a-g}$, $106_{a-g}$ attached thereto to articulate in a direction 117 between various vertical positions perpendicular to the plane 119 of the polymer or polymeric foam material 118. For example, FIG. 4 shows low mass element $104_a$ extended or projected upward, in relation to low mass element $106_a$, to a first position 114, contacting the outer surface 108 of the user's skin 110, while FIG. 5 shows low mass element $106_a$ extended or projected upward, in relation to low mass element $104_a$, to a second position 116, contacting the outer surface 108 of the user's skin 110, the two positions 114, 116 configured to realize a thermal effusivity between the first collective thermal effusivity of the first array of low mass elements $104_{a-g}$, i.e., using all the elements of the first array together in unison, and the second array of low mass elements $106_{a-g}$, likewise, using all the elements of the second array together in unison, shown in their entirety in FIGS. 2 and 3. FIG. 6 further illustrates the resilient nature of the polymer or polymeric foam material 118, showing the low mass elements $104_a$, $106_a$ in a non-extended or quiescent position 120. It will be appreciated by those of ordinary skill in the art that this likewise can apply to the additional elements $104_{b-g}$, $106_{b-g}$ shown in FIGS. 2 and 3.

Still referring to FIGS. 2-6, the elements $104_{a-g}$, $106_{a-g}$ can in some embodiments, have a layer of thermal interface material 122, as shown in detail in FIGS. 4-6, that contacts the user's skin 110. The thermal interface material 122 preferably has a low thermal mass, meaning the product of the material's mass and its specific heat capacity is relatively small. In one embodiment, over all the elements $104_{a-g}$, $106_{a-g}$, the average product of the specific heat and the mass, i.e., the thermal mass, of the thermal interface material 122 is less than about 0.07 joules per degree Centigrade (J/° C.). As examples, the thermal interface material 122 can be a thin layer to minimize the mass such that it is on the order of several hundredths of a gram per element and can be a metal such as aluminum or copper, or an interstitial compound such as tungsten carbide, or a ceramic such as beryllium oxide, aluminum oxide, or aluminum nitride. These examples of suitable materials strike a balance between somewhat low specific heat and relatively good thermal conductivity, such that the thermal conductivity divided by the product of the specific heat and the density is on the order of 100 per square meter-second ($1/(m^2*sec)$) or more. In one embodiment, the thermal conductivity divided by the product of the specific heat and the density is between about 100 and about 1,000 ($1/(m^2*sec)$). The thermal effusivity is preferably as high as possible, and on the order of 20 kiloJoules per root second per meter squared per Kelvin ($kJ/\sqrt{sec}/m^2/K$). In one embodiment, the thermal effusivity is between about 10 and about 100 $kJ/\sqrt{sec}/m^2/K$. In other embodiments, suitable materials include graphitic carbon or a polymer composite that has been engineered to have a relatively high thermal conductivity, yet low overall thermal mass, i.e., due to its low density, or a composite material such as those listed hereinabove, e.g., a metallized ceramic.

The elements $104_{a-g}$, $106_{a-g}$ can in some embodiments, and as described in conjunction with FIG. 1, include tunable thermal devices 18, such as, for example, Peltier modules. For example, Peltier modules 124 are shown in FIGS. 4-6, each of which can be electrically coupled to a power source to operate in unison or individually in response to a virtual or augmented reality simulation running on computer or a control unit 14, shown in FIG. 1, to provide thermoreceptive haptic feedback to simulate different objects that appear in the simulation and that contact the user's avatar in the simulation. In other embodiments, the device 102 can include one or more Peltier heater/coolers having a first side and a second side, the first side coupled to the first array of low mass elements and the second side coupled to the second array of low mass elements, and configured to pass heat there between.

Figure 7:
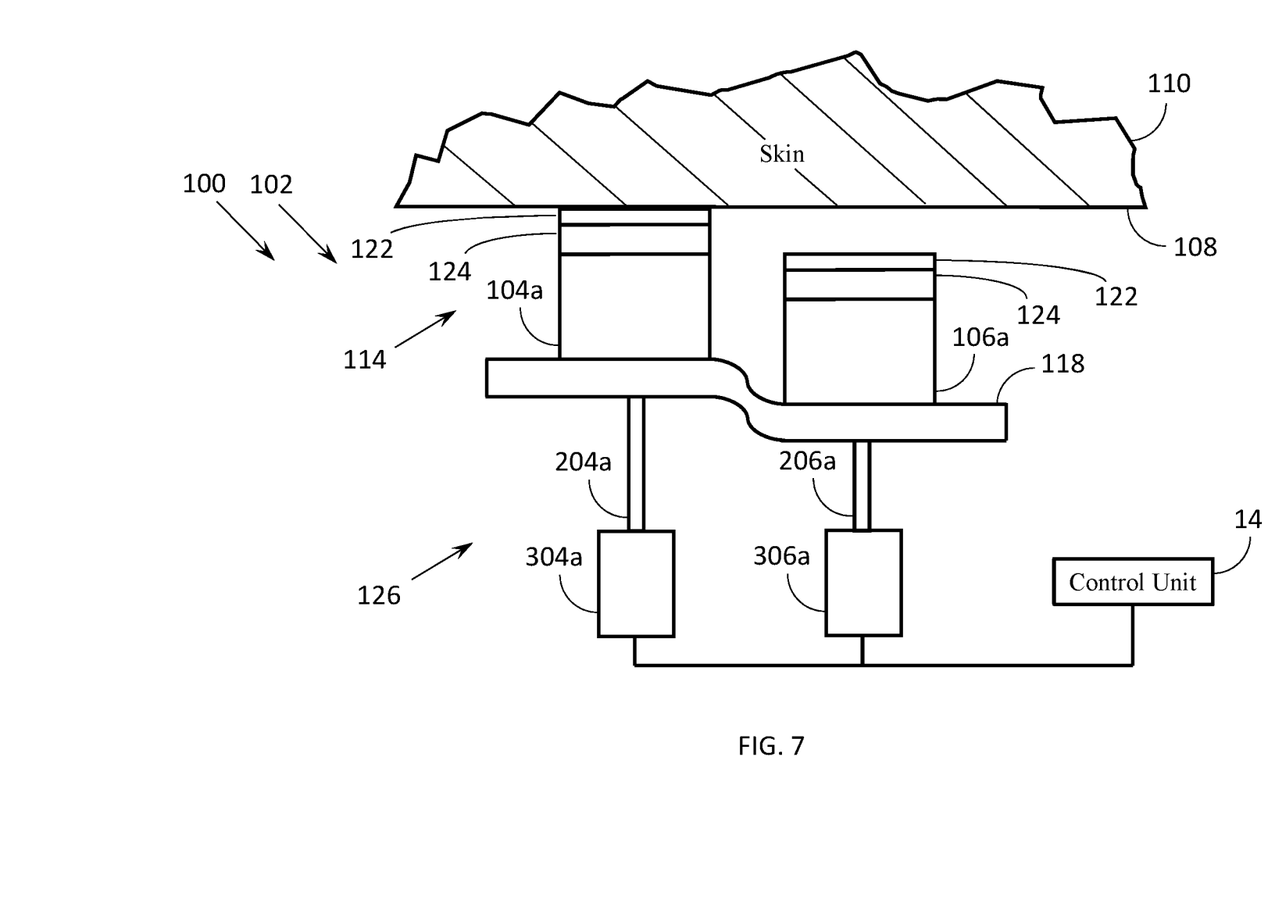
FIG. 7 is a diagram of an exemplary mechanical switching means coupled to low mass elements.

Referring now to FIG. 7, an exemplary mechanical switch 126 for use with the low mass elements $104_{a-g}$, $106_{a-g}$ is shown. For example, and in one embodiment, the mechanical switch 126 can include a corresponding drive mechanism, e.g., a motor, solenoid, etc., $304_{a-g}$, $306_{a-g}$ for each low mass element $104_{a-g}$, $106_{a-g}$, respectively, in each array 104, 106, only two of which are shown in FIG. 7 for purposes of clarity. In other embodiments, a drive mechanism can use piezoelectric actuation or compressed fluid, e.g., air, pneumatic actuation in the form of air-filled membranes that are coupled to the low mass elements, and that can be inflate or deflate as needed to drive the elements into and out of contact with the skin of a user. In some embodiments, a dedicated shaft or linkage $204_{a-g}$, $206_{a-g}$ couples each drive mechanism $304_{a-g}$, $306_{a-g}$ to each low mass element $104_{a-g}$, $106_{a-g}$, respectively. Each drive mechanism $304_{a-g}$, $306_{a-g}$ is electrically coupled to the control unit 14. For example, and for further clarity, drive mechanism $304_a$ is associated with low mass element $104_a$, shaft $204_a$ mechanically coupling them together, while drive mechanism $306_a$ is associated with low mass element $106_a$, shaft $206_a$ mechanically coupling them together, both of which are in electrical communication with the control unit 14.

In operation, and in response to a virtual or augmented reality simulation running thereon, the control unit 14 can, for example, actuate drive mechanism $304_a$ to extent shaft $204_a$, causing low mass element $104_a$ to contact the outer surface 108 of the user's skin 110 as shown. The control unit 14 can also actuate other the drive mechanisms $304_{b-g}$, $306_{a-g}$ to cause other low mass elements $104_{b-g}$, $106_{a-g}$ to contact the user's skin 110 as desired, based on the programming of the control unit 14.

This, in turn, causes the user to perceive either a change in temperature due to contacting a material with a different thermal effusivity, i.e., one or more low mass elements, and/or a material having a different temperature, i.e., the heated and/or cooled one or more low mass elements, that are associated with an item in the virtual or augmented reality simulation running on the control unit, and based upon the item profile stored in memory in the control unit.

Moreover, in response to a virtual or augmented reality simulation running thereon, the control unit 14 can actuate the drive mechanisms $304_{a-g}$, $306_{a-g}$, collectively as arrays 104, 106 or individually, selecting only portions of the arrays, and without any additional temperature compensation and/or heating, to realize a thermal effusivity between the first collective thermal effusivity of the elements $104_{a-g}$ in the first array 104 and a second collective thermal effusivity of the elements $106_{a-g}$ in the second array 106. With additional temperature compensation and/or heating, i.e., using tunable thermal devices, thermal effusivities beyond, e.g., greater than or less than, the first collective thermal effusivity of the elements $104_{a-g}$ in the first array 104 and a second collective thermal effusivity of the elements $106_{a-g}$ in the second array 106, can be realized.

In other embodiments, those of ordinary skill in the art will appreciated that the low mass elements within each array can be ganged together, each array of low mass elements actuated by a separate drive mechanism without departing from the spirit of the present invention.

Figure 8:
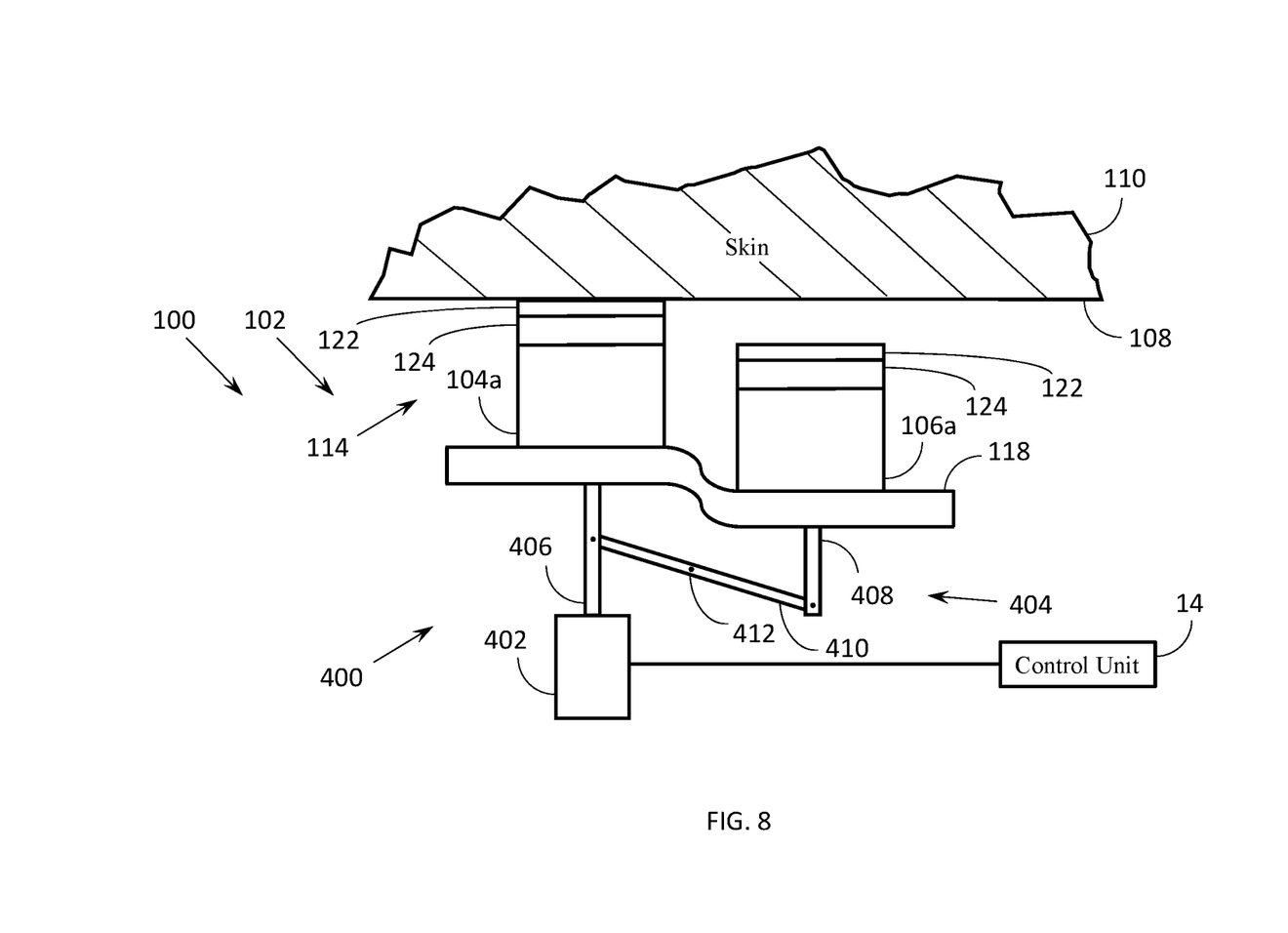
FIG. 8 is a diagram of an alternative mechanical switching means coupled to low mass elements.

Referring to FIG. 8, an alternative mechanical switch 400 is shown. As depicted, the alternative mechanical switch 400 comprises at least one drive mechanism 402, for example, a motor or solenoid, etc., and linkage 404 mechanically coupling the drive mechanism 402 to two or more low mass elements, e.g., $104_a$, $106_a$, each of which is in a different array or has a different thermal effusivity and/or temperature. The mechanical switch 400 is coupled to the control unit 14 by virtue of drive mechanism 402 being electrically connected to the control unit 14 for the purpose of at least one of electrical control, i.e., controlling the application of power, and power delivery.

The linkage 404 is comprised of a first shaft 406 directly coupling the drive mechanism 402 to low mass element $104_a$, a second shaft 408 coupled to low mass element $106_a$, and a rocker arm 410 pivotably mounted on a fulcrum point 412, and mechanically coupling the first and the second shafts 406, 408, respectively, together. As configured, when control unit 14 actuates drive mechanism 402 in response to a virtual or augment reality simulation, causing shaft 406 to travel upward, low mass element 104a engages the user, rocker arm 410 causes shaft 408 to travel downward, and low mass element 106a moves away from the user. Similarly, when control unit 14 actuates drive mechanism 402 in response to a virtual or augment reality simulation, causing drive mechanism 402 causing shaft 406 to travel downward, low mass element 104a moves away from the user, rocker arm 410 causes shaft 408 to travel upward, and low mass element 106a engages the user. Thus, as so configured, alternative mechanical switch 400 allows two different low mass elements, e.g., $104_a$ and $106_a$, each having a different thermal effusivity and/or temperature, to contact a user alternately in response to a virtual or augmented reality simulation experienced by the user.

Figure 9:
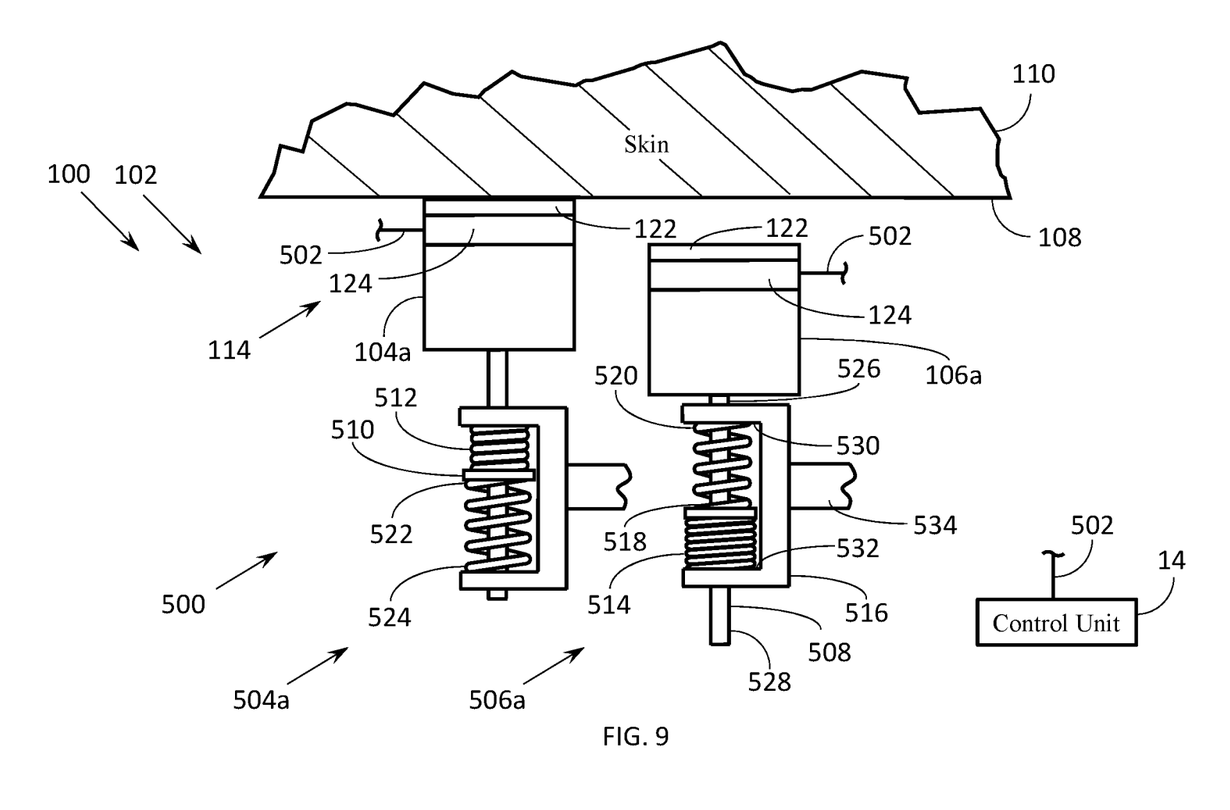
FIG. 9 is a diagram of another alternative mechanical switching means coupled to low mass elements.

Referring now to FIG. 9, another alternative mechanical switch 500 for use with the low mass elements 104a-g, 106a-g is shown. Again, in some embodiments, the low mass elements 104a-g, 106a-g include thermoelectric Peltier modules 124 and the alternative mechanical switch 500 comprises corresponding shape-memory alloy (SMA) actuators 504a-g, 506a-g, one for each low mass element 104a-g, 106a-g, respectively mechanically coupled thereto, only two of which are shown for ease of explanation. The thermoelectric Peltier modules 124 are electrically coupled to a control unit 14, such as through wiring or cabling 502, and as previously mentioned in the discussion of FIGS. 4-6, each of which can be electrically coupled to a power source to operate in unison or individually in response to a virtual or augmented reality simulation running on computer or a control unit 14, also shown in FIG. 9, to provide thermoreceptive haptic feedback to simulate different objects that appear in the simulation and that contact the user's avatar in the simulation.

Each SMA actuator 504a-g, 506a-g comprises an armature 508 having a centrally located two-sided spring seat 510, a bias spring 512, a shape-memory alloy (SMA) spring 514, and a housing or mounting frame 516 having first and second opposing spring seats 530, 532. For purposes of explanation, the armature 508 has a first end 526 and second end 528, the bias spring 512 also has a first end 518 and a second end 520, and likewise, the SMA spring 514 also has a first end 522 and a second end 524. The frame 516 can also be used for purposes of mounting the actuator such as to a support structure 534 included in a handheld or wearable technology, such as, for example, in a game controller or a glove, thereby stabilizing or fixing the actuator relative to the outer surface 108 of a user's skin 110.

To assemble each SMA actuator 504a-g, 506a-g, the bias spring 512 and the SMA spring 514 are slid over the ends 526, 528 of the armature 508 on opposite sides of the centrally located two-sided spring seat 510. For example, the first end 518 of the bias spring 512 is slid over the first end 526 of the armature 508 and the first end 522 of the SMA spring 514 is slid over the second end 528 of the armature 508, the first ends 518, 522 of the bias and the SMA springs 512, 520, respectively, coming to rest or "seating" on opposite sides of the centrally located two-sided spring seat 510. Next, the bias spring 512 is compressed against the spring seat 510 of the armature 508, and the armature 508, with the bias and SMA springs 512, 514 located thereon, is inserted into the mounting frame 516. The bias spring is then allowed to expand seating the second end 520 of the bias spring 512 against the first spring seat 530 of the frame 516 and further seating the first end 522 of the SMA spring 514 against the spring seat 510 and the second end 524 of the SMA spring 514 against the second spring seat 532 of the frame 516, thereby defining a "quiescent" condition or static relative positioning of the armature 508 in relation to the frame 516 without an associated thermoelectric Peltier module 124 mechanically coupled to the armature 508 being energized. For example, the SMA actuator 506a is shown in the quiescent condition in FIG. 9, the low mass element 106a mechanically coupled thereto not contacting the outer surface 108 of a user's skin 110.

In some embodiments, the SMA springs 514 can be constructed or formed from shape-memory wire, e.g., SmartFlex® Wire, available from SAES Getters S.p.A. headquartered in Lainate (Milan), Italy. The selection of the model of the SmartFlex® Wire, e.g., SmartFlex 25, SmartFlex 50, SmartFlex 76, SmartFlex 100, SmartFlex 150, SmartFlex 200, SmartFlex 300, SmartFlex 400, and SmartFlex 500, relating to the diameter of the wire, e.g., 25, 50, 76, 100, 150, 200, 300, 400, and 500 micrometers (µm), respectively, and determining the corresponding suggested operating force of 0.1, 0.3, 0.8, 1.3, 2.7, 5, 12, 21, and 33 Newtons (N) of the spring formed using the wire, the suggested operating stroke of the spring being less than 3.5 percent (<3.5%) of the spring length and the maximum stoke being less than 5 percent (<5%). Those of ordinary skill in the art will appreciate that in the SMA actuators 504a-g, 506a-g, the SMA spring 514 must be able to exert enough force against the armature 508 to overcome that force exerted by the bias spring, i.e., the force require to compress the bias spring 512, the difference in the force generated by the SMA spring 514 minus the force required to compress the bias spring 512 being equal to the contact force with which a low mass element 104a-g, 106a-g presses against the outer surface 108 of a user's skin 110.

To cause an SMA spring to expand and exert the contact force, the SMA 514 spring can be heated. In accordance with principles of the present invention, this can be accomplished using one of two methods or a combination of those two methods. For example, in the first method, a current is passed through the wire forming the SMA spring, and is an application of Joule heating or Ohmic heating or resistive heating, the process by which the passage of an electric current through a conductor produces heat, i.e., the wire forming the SMA spring, the SMA spring, in effect, heating itself in accordance with principles of the present invention. For example, this first method can be applied as shown in FIG. 9, by passing a current from the first end 522 of the SMA spring 514 to the second end 524, the control unit 14 controlling the application of the current in response to a virtual reality simulation running thereon.

The second method of heating an SMA spring is by some external means, or through radiation or conduction. For example, and in some embodiments of the present invention, the thermoelectric Peltier module 124 contained within each low mass element 104a-g, 106a-g and mechanically coupled to a respective SMA actuator 504a-g, 506a-g can provide the radiant and/or conductive heat necessary to cause to the SMA spring 514 included in the respective SMA actuator 504a-g, 506a-g to expand causing the low mass element 104a-g, 106a-g to contact the surface 108 of the skin 110 of a user as will now be described.

Referring specifically to SMA actuator 506a in FIG. 9, the actuator is in the "quiescent" state and the low mass element 106a is not in contact with the surface 108 of the skin 110 of a user as shown. However, to provide a cool or cold sense of haptic feedback to a user in a virtual reality simulation, the control unit 14 energizes the thermoelectric Peltier module 124 included in the low mass element 106a so as to cause the upper surface of the thermoelectric Peltier module 124 proximate the skin 110 to become cold and the lower surface proximate the SMA actuator 506a to become hot. This is caused by the orientation of the polarity of the voltage applied to the thermoelectric Peltier module 124.

The heat from the thermoelectric Peltier module 124 travels through the low mass element 106a, through the armature 508 and the spring seat 510, reaching the SMA spring 514, i.e., conduction, causing the SMA spring 514 to expand or elongate, the first and second ends 522, 524 moving further apart. Similarly, radiant heat from the thermoelectric Peltier module 124 also reaches the SMA spring 514 causing the SMA spring 514 to expand or elongate. Those of ordinary skill in the art will appreciate that in some embodiments of the present invention, conduction can play a small or insignificant roll in heating the SMA spring 514, the spring being primarily elongated through heat received through radiation, i.e., radiant heat. In still other embodiments of the present invention, wherein the SMA spring 514 is in thermal contact with the thermoelectric Peltier module 124 via the armature 508 and the mounting frame 516, conduction can dominate over convection, which can dominate over radiation.

When the SMA sprint 514 elongates, it exerts enough force on the armature 508 to overcome the force exerted on the armature 508 by the bias spring 512 and the armature 508 forces or moves the low mass element 106a upward in FIG. 9, the low mass element 106a coming into to contact with the outer surface 108 of the user's skin 110. SMA actuator 504a and low mass element 104a are shown in this position in FIG. 9, the control unit 14 maintaining this position for the time specified in the virtual reality simulation.

Once the cool or cold sensation is no longer called for in the virtual reality simulation, the control unit 14 reverses the polarity of the voltage applied to the thermoelectric Peltier module 124. The thermoelectric Peltier module 124 then pumps heat from the hot side to the cold side and the upper surface of the thermoelectric Peltier module 124 proximate the skin 110 becomes hot and the lower surface proximate the SMA actuator 506a to becomes cold. This absorbs heat from the SMA spring 514, the SMA spring contracts, aided by the bias spring 512, and the SMA actuator returns to is "quiescent" state, the associated low mass element no longer contacting the user's skin. Again, actuator 506a and low masses element 106a are shown in this state in FIG. 9.

Those of ordinary skill in the art will appreciate that embodiments of the present invention including an SMA actuator can benefit from not having to have cabling and/or wiring running to an actuator for purposes of a low mass element selecting containing a user's skin.

Further, those of ordinary skill in the art will also appreciate that, for example, SMA actuators from SAES Getters S.p.A. experience a thermal hysteresis such that they apply force (extension) upon heating, which saturates at some temperature. The actuators must then be undercooled for them to contract. This effectively makes them compression springs that are designed to resist compressive forces. Moreover, the transition temperature can be tuned based on the alloy composition. For example, alloys containing nickel and titanium, i.e., a nickel-titanium alloy or Nitinol™, and designated in Class BD by SAES Getters S.p.A. as mentioned hereinabove, can have a transition temperature of 20 or 30° C. In principle, the actuator can be designed so that its original state is compressed (austenite), which can be recovered by heating or upon cooling, it would extend. This configuration would be a tension spring, which is designed to resist tensile forces. The present invention also contemplates these types of actuators as well and those or ordinary skill in the art would also appreciate and understand their application for the teachings contained herein.

While various embodiments of a device for providing thermoreceptive haptic feedback have been illustrated by the foregoing description and have been described in considerable detail, it is not intended to restrict or in any way limit the scope of the appended claims to such detail. Additional advantages and modifications will be readily apparent to those skilled in the art.

What is claimed is:

1. A device for providing thermoreceptive haptic feedback comprising:
    a first array of low mass elements, arranged in a geometric pattern, the array having a first temperature and a first collective thermal effusivity, and configured for selectively contacting a user;
    a second array of low mass elements, interspersed among the low mass elements of the first array, and thermally isolated from the low mass elements of the first array, the array having a second temperature and a second collective thermal effusivity, and configured for selectively contacting a user; and,
    a means for mechanical switching coupled to the low mass elements of the first and the second arrays and configured to place selected low mass elements of the first and the second arrays in contact with a user, to realize a thermal effusivity between the first collective thermal effusivity and the second collective thermal effusivity.

2. The device of claim 1, further comprising a first temperature means for at least one of raising and lowering the first temperature of the first array of low mass elements.

3. The device of claim 2, further comprising a second temperature means for at least one of raising and lowering the second temperature of the second array of low mass elements.

4. The device of claim 3, wherein the first and the second temperature means is selected from the group consisting of resistive heating, infrared heating, controlled chemical reactions, evaporative cooling, liquid cooling/heating, forced air cooling and heating, phase change materials, at least one of nanowire, nanotube, and nano-mesh, flexible thermoelectric materials, and materials having variable and tunable thermal conductivity and heat capacity.

5. The device of claim 3, wherein each of the first and the second temperature means is one or more Peltier modules.

6. The device of claim 3, wherein the first and the second temperature means is one or more Peltier modules having a first side and a second side, the first side coupled to the first array of low mass elements and the second side coupled to the second array of low mass elements, and configured to pass heat there between.

7. The device of claim 2, wherein the first temperature means is selected from the group consisting of resistive heating, infrared heating, controlled chemical reactions, evaporative cooling, liquid cooling/heating, forced air cooling and heating, phase change materials, at least one of nanowire, nanotube, and nano-mesh, flexible thermoelectric materials, and materials having variable and tunable thermal conductivity and heat capacity.

8. The device of claim 2, wherein the first temperature means is one or more Peltier modules.

9. The device of claim 2, wherein the first temperature means is one or more Peltier modules having a first side and a second side, the first side coupled to the first array of low mass elements and the second side coupled to the second array of low mass elements, and configured to pass heat there between.

10. The device of claim 1, further comprising a sensor configured to measure the skin temperature of a user, the skin temperature used to calibrate the device to a virtual reality simulation.

11. The device of claim 10, further comprising a control unit electrically coupled to the means for mechanical switching and the sensor, the control unit configured to actuate the means for mechanical switching in response to the measured skin temperature to calibrate the virtual reality simulation.

12. The device of claim 1, further comprising a feedback system, the feedback system including a temperature sensor configured to measure the skin temperature of a user and a control unit electrically coupled to the temperature sensor and the means for mechanical switching, the control unit responsive to a virtual reality simulation, and configured to actuate the means for mechanical switching in response to the temperature sensor and the virtual reality simulation.

13. The device of claim 12, the controller further configured to actuate the means for mechanical switching to place selected low mass elements of the first and the second arrays in contact with a user to realize a thermal gradient across the skin of a user.

14. A method of providing thermoreceptive haptic feedback to a user viewing a virtual reality simulation comprising:
    storing a thermal profile for a virtual item;
    at least one of assuming the skin temperature for the user and sensing the skin temperature of the user;
    actuating a means for mechanical switching coupled to a first and a second array of low mass elements, the means for mechanical switching coupled to the low mass elements of the first and the second arrays configured to place selected low mass elements of the first and the second arrays in contact with a user, the first array of low mass elements, arranged in a geometric pattern, the array having a first temperature and a first collective thermal effusivity, the second array of low mass elements, interspersed among the low mass elements of the first array, and thermally isolated from the low mass elements of the first array, the second array having a second temperature and a second collective thermal effusivity;

placing selected low mass elements of the first and the second array in contact with the user based on the thermal profile for the virtual item in response to the virtual reality simulation displaying the item.

15. The method of claim 14, further comprising energizing a temperature means for at least one of raising and lowering the temperature of the elements in the first array.

16. The method of claim 14, further comprising energizing a temperature means for at least one of raising and lowering the temperature of the elements in the second array.

17. The method of claim 14, further comprising energizing a temperature means for heating and cooling low mass elements in the first and the second arrays, wherein at least one of the elements in the first array is heated while at least one of the elements in the second array is simultaneously cooled.

18. The method of claim 14, further comprising calibrating the application of a material with a selected thermal effusivity to the skin temperature of the user.

19. The method of claim 14, further comprising placing selected low mass elements of the first and the second arrays in contact with the user to realize a thermal gradient across the skin of the user.

\* \* \* \* \*